United States Patent
Sinha et al.

(10) Patent No.: US 8,122,404 B2
(45) Date of Patent: Feb. 21, 2012

(54) PERFORMING A STATISTICAL TIMING ABSTRACTION FOR A HIERARCHICAL TIMING ANALYSIS OF VLSI CIRCUITS

(75) Inventors: Debjit Sinha, Wappingers Falls, NY (US); Adil Bhanji, Wappingers Falls, NY (US); Barry L. Dorfman, Austin, TX (US); Kerim Kalafala, Rhinebeck, NY (US); Natesan Venkateswaran, Hopewell Junction, NY (US); Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 508 days.

(21) Appl. No.: 12/388,932

(22) Filed: Feb. 19, 2009

(65) Prior Publication Data

US 2010/0211922 A1 Aug. 19, 2010

(51) Int. Cl.
*G06F 17/50* (2006.01)
(52) U.S. Cl. .................................. 716/108; 716/134
(58) Field of Classification Search .................. None
See application file for complete search history.

(56) References Cited

U.S. PATENT DOCUMENTS

| | | | |
|---|---|---|---|
| 6,158,022 A | 12/2000 | Avidan | |
| 6,581,197 B1 | 6/2003 | Foutz et al. | |
| 6,604,227 B1 | 8/2003 | Foltin et al. | |
| 6,609,233 B1 | 8/2003 | Foltin et al. | |
| 6,928,630 B2 * | 8/2005 | Moon et al. | 716/134 |
| 6,996,515 B1 | 2/2006 | Foltin et al. | |
| 7,036,100 B2 | 4/2006 | Tyler et al. | |
| 7,111,260 B2 | 9/2006 | Visweswariah | |
| 7,350,171 B2 * | 3/2008 | Zhang et al. | 716/108 |
| 7,353,359 B2 * | 4/2008 | Kalafala et al. | 711/173 |
| 7,437,697 B2 * | 10/2008 | Venkateswaran et al. | 716/113 |
| 7,684,969 B2 * | 3/2010 | Habitz et al. | 703/14 |
| 7,788,617 B2 * | 8/2010 | Bhanji et al. | 716/113 |
| 7,793,245 B2 * | 9/2010 | Zhang et al. | 716/113 |
| 8,005,660 B2 * | 8/2011 | Chiu et al. | 703/14 |
| 2008/0114572 A1 * | 5/2008 | Feldmann et al. | 703/2 |

OTHER PUBLICATIONS

A.B. van der Wal et al., "Hierarchical Statistical Verification of Large Full Custom CMOS Circuits," IEEE (no date),pp. 443-446.*
Visweswariah et al. in "First-order incremental block-based statistical timing analysis," Proc. of the Design Automation Conf., 2004, pp. 331-336.

* cited by examiner

*Primary Examiner* — Leigh Garbowski
(74) *Attorney, Agent, or Firm* — H. Daniel Schnurmann

(57) ABSTRACT

A method for performing a hierarchical statistical timing analysis of an integrated circuit (IC) chip design by abstracting one or more macros of the design. The method includes performing a statistical static timing analysis of at least one macro; performing a statistical abstraction of the macro to obtain a statistical abstract model of the macro timing characteristics; applying the statistical abstract model as the timing model for each occurrence of the macro leading to a simplified IC chip design; and performing a hierarchical statistical timing analysis of the simplified chip design. The method achieves a context aware statistical abstraction, where a generated statistical abstract model is instantiated for each macro of the chip during statistical static timing analysis at the chip level, providing a compressed and pruned statistical timing abstraction and reducing the model-size during the statistical abstraction.

16 Claims, 2 Drawing Sheets

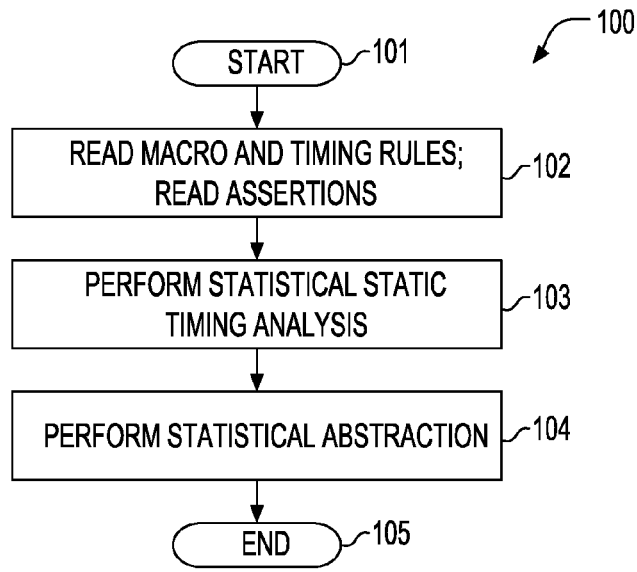

PERFORMING A STATISTICAL TIMING ABSTRACTION FOR A HIERARCHICAL TIMING ANALYSIS OF VLSI CIRCUITS

FIELD OF THE INVENTION

The invention generally relates to the field of Design Automation, and more particularly, to the generation of statistical timing abstract models of Very Large Scale Integrated (VLSI) circuits.

RELATED PRIOR ART

Static Timing Analysis (STA) is a key step in the design of high speed VLSI circuits. STA is used to verify that a VLSI circuit design performs correctly at a required frequency before it is released to manufacturing. With modern chip manufacturing technology scaling to sub 65 nanometers, VLSI designs are becoming increasingly larger in terms of size and complexity. Performance centric designs, especially microprocessor designs, contain custom circuit designed components called macros to achieve aggressive frequency targets. STA of the macros employ circuit simulators for device delays and slew calculations. In STA, a design is represented as a timing graph. The points in the design where timing information is desired form the nodes or timing points of the graph, while electrical or logic connections between the nodes are represented as timing arcs thereof.

Modern day Application Specific Integrated Circuit (ASIC) designs contain several million gates while modern microprocessor designs may contain upwards of one billion transistors. Circuit simulation, while highly accurate at transistor level designs, is run-time intensive. Thus, it is not practical to use it in a timing flow where timing runs are typically made on a daily basis during the design cycle of a chip. In essence, static timing analysis of such large circuits as a single flattened design is run-time prohibitive.

This has led to the development of a hierarchical timing flow where custom parts of the design are timed using accurate timing models (e.g., using transistor level timing tools with circuit simulation type accuracy in the case of microprocessor designs); followed by the generation of timing abstract models that reflect in a simpler form, the actual timing characteristic of the custom logic. The latter step is termed timing abstraction. For ease of notation in the invention, the term macro will be used to denote any circuit being abstracted. The generated abstracts capture the timing characteristic of the macro by the use of slew and load dependent tables to model the timing behavior of the logic.

Delays and output slews (or waveforms) of timing arcs near the Primary Inputs (PI) of the macro are characterized as functions of input slew, while delays and output-slews of arcs closer to the Primary Outputs (PO) are characterized as functions of output load, and sometimes a combination of both. This allows a generated abstract model to be used in multiple boundary condition (PI and PO) settings. Timing abstraction employs techniques to reduce the size of the timing graph by performing pruning as well as arc compression. The techniques advantageously reduce the number of timing arcs to be timed to the next hierarchical level. Model reductions of 75% are common. At the next level of hierarchy (often at the chip level), macros are represented by the abstracts. The hierarchical timing approach enables fast timing analysis and productivity at the chip level, since the abstract models are simpler and allow re-use. The benefits are highlighted when multiple instances of a macro are used at the chip level since the flow avoids separate static timing analysis for each instance of the macro.

The impact of process variability in modern day chip designs and manufacturing is significant in terms of the timing performance of a given VLSI circuit. In addition to process variability, environmental variations (e.g., variations in power supply Vdd and temperature) contribute to the uncertainty in the design timing characteristics. Statistical Static Timing Analysis (SSTA) has subsequently emerged as a solution to address the issues and considers the impact of variations during timing analysis and optimization. In SSTA, timing quantities like delays and slews are treated as random variables with known distributions. Each timing quantity may be sensitive to multiple global sources of variability which are termed parameters. The global parameters are denoted as $\{X_1, X_2, X_3, \ldots, X_{n-1}\}$. Moreover, a timing quantity is also considered to be sensitive to an uncorrelated or local source of variability R.

A commonly used canonical representation of a statistical timing quantity T is given by the following equation $$T = t_0 + \sum_{i=1}^{n-1} t_i \Delta X_i + t_r \Delta R_T \quad \text{(EQ. 1)}$$

wherein, $t_0$ is the mean value of the timing quantity T; $t_i$ is the sensitivity of T to a variation $\Delta X_i$ of the global parameter $X_i$; and $t_r$ is sensitivity of T to uncorrelated variation $\Delta R_T$.

It is assumed that the global parameters $X_i$ are the same for the delays of all digital cells and interconnects of the circuit, while uncorrelated variations $\Delta R_T$ are statistically independent for different digital cells and interconnect wires.

Prior art approaches to hierarchical timing using abstraction employ deterministic timing models, and thus generate a deterministic timing abstract for the given design (for which the abstract was created). Such models do not capture the timing variability information of the abstracted design. Since abstract models are often compressed, it is not possible to accurately associate some variability information from the original design with the created deterministic abstract model. Generation of multiple abstract models for different settings of the sources of variability is impractical in terms of run-time. As a result, prior art methods suffer from inability to model the timing variability in a macro being abstracted. This may lead to excessive guardbanding, timing yield loss and functional chip failure at the desired performance.

SUMMARY OF THE INVENTION

Accordingly, it is an object of the present invention to provide a method and a system for performing the statistical timing abstraction of a VLSI circuit design such that the generated abstract model captures the timing characteristics of the design accurately under the impact of given sources of variability.

It is another object of the invention to provide a method to perform a parameterized statistical abstraction of a circuit, where timing quantities in the abstract model are expressed in a parameterized statistical form (e.g., a first order canonical form as shown in EQ. 1).

It is still another object of the invention to provide a method providing context aware statistical abstraction, where a generated statistical abstract model is instantiated for each instance of the macro in a chip during a hierarchical STA at the chip level.

It is yet another object of the invention to provide a method that provides compressed and/or pruned statistical timing abstraction.

It is a further object of the invention to provide a method to achieve a model-size reduction during statistical abstraction, wherein given a statistical timing quantity like delay of a timing arc or slew at a timing point in which sensitivities to parameters are stored relative to the deterministic delay or slew for a timing quantity.

These and other objects, aspects and advantages of the invention are achieved by a method of statistical timing abstraction of a given macro. The method generates a simpler statistical timing model or abstract of the macro; the abstract is then used for each instance of the macro during a chip level hierarchical statistical static timing analysis thereby facilitating faster yet accurate analysis either for final chip performance verification or during chip timing optimization. The generated timing abstract model preserves desired timing checks as well as the timing characteristics of a given circuit at its input and output boundaries, while reducing the size and complexity of the original timing model.

In another aspect of the invention, there is provided a method of improving the performance of an integrated circuit (IC) chip by way of a hierarchical statistical timing analysis of the IC chip design, the method including: a) performing a statistical static timing analysis on one or more macros of the IC chip design; b) performing a statistical abstraction of the macro to generate a statistical abstract model of its timing characteristics; c) applying the statistical abstract model as the timing model for each occurrence of the macro leading to a simplified IC chip design; and d) performing a hierarchical statistical timing analysis of the simplified IC chip design, and modifying the IC chip design based thereon.

BRIEF DESCRIPTION OF DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIG. 1 is a flowchart illustrating method steps of a statistical timing abstraction of a VLSI circuit or macro, according to an embodiment of the invention.

FIG. 2 illustrates a memory saving method according to an embodiment of the invention for storing sensitivity to parameters as a fraction of deterministic delay or slew instead of absolute values.

DETAILED DESCRIPTION

Figure 3:
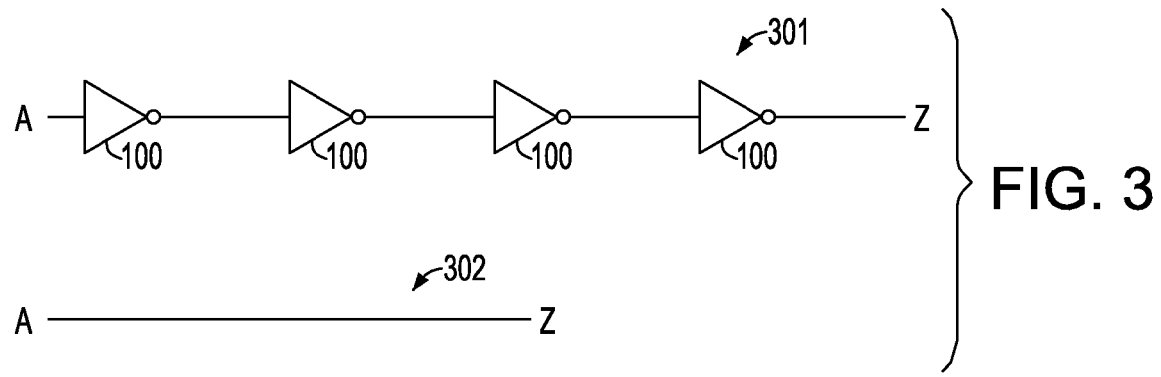
FIG. 3 illustrates a chain of four INVERTER gates.

The present invention and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure details of the present invention.

Referring to FIG. 1, there is shown a flow diagram illustrating an embodiment of a method for generating a statistical timing abstract model of a macro. Method 100 is initialized in step 101. In step 102, the macro is read in along with the timing models for the macro and timing assertions. The macro may be a gate level design with industry standard timing models such as Liberty©, or may be a transistor level design which requires a circuit simulator to obtain delay and slew (or waveform) information during static timing analysis. The statistical timing model for the design is also read in during the step. The models may be represented in an industry standard format like S-ECSM© (Statistical Effective Current Source Model) or may be based on finite differencing of deterministic timing models characterized at different process corners. Alternatively, one can specify asserted sensitivity to the different parameters to model the statistical effects. The step sets up the sources of variation or parameters for statistical timing.

In step 103, a statistical static timing analysis of the macro is performed, wherein timing parameters such as delays and slews are represented as random variables with known distributions and are propagated throughout the timing graph to obtain arrival times at the primary outputs. Required arrival times are propagated in a conventional manner, and slacks are obtained at every timing point of the timing graph. The step may include traditional static timing analysis components like coupling analysis, common path pessimism reduction, and report generation.

In step 104, statistical timing abstraction of the macro is performed. Abstract models to be generated are specified to be either complete abstracts or boundary abstracts. For complete abstracts, no pruning of the timing graph is performed and an abstract is generated for the complete timing graph. However, for boundary abstracts, internal latch-to-latch paths in the timing graph are pruned. Timings arcs between primary inputs to the first latch input boundaries, and those between latch outputs to the primary outputs are retained for abstraction. The latter model assumes that timing requirements for the internal latch-to-latch paths are satisfied by a macro designer before the abstract is released for hierarchical timing at the chip level, where the timing for only the boundary paths needs to be verified. The boundary abstract model size is therefore smaller than that of a complete abstract model. A blackbox abstract is a form of boundary abstract where no internal timing points are retained. The timing abstract model preferably includes timing arcs only between primary inputs and outputs. It should be noted that the present invention is not limited to any particular set of abstraction technique(s). The statistical abstraction presented herein is applicable to any prior art compression/pruning technique.

In a timing abstraction, timing arcs within a predetermined number of logic stages from the primary inputs are considered to be dependent on an input waveform shape or slew. In addition, some timing arcs in the fan-out cone of the timing graph where multiple arcs merge may also be considered slew dependent. The delay and output waveform (or slew) of each of the arcs are characterized as a function of input slew. The characterization range may be specified as an absolute range, or a relative range based on slews in the original timing graph.

In the characterization process of the arc, the timing model returns a statistical parameterized model of the arc delay and/or a parameterized model of the slew at the sink of the arc as a function of one or more timing quantities (like input slew of that arc as previously described).

Timing arcs whose delays and output slews are affected by the value of the load at the primary outputs of the macro are considered to be load dependent. The delays and output slews of the arcs are characterized as a function of capacitive load, wherein multiple statistical parameterized delays and/or output slews are obtained for various values of load at the primary output. The characterization range is specified either as an absolute range or specified as a relative range based on the values of the load at the primary outputs of the macro.

Certain timing arcs are considered both input slew and load dependent; an example thereof being a timing arc across an inverter having its input connected to a primary input and its output connected to a primary output of the macro. The delay and output slew of such arcs are characterized as a function of both input slew and output load.

All remaining timing arcs in the timing graph of the macro are considered to have either a fixed delay and output slew or information obtained from an equation/table. Statistical parameterized models of the timing quantities from the macro timing graph are preferably used during abstraction.

The arcs in the timing graph denoting timing tests may be considered slew dependent for either or both timing points at the ends of the arc depending on the topological location of the timing points. The test guard-times for the arcs are characterized accordingly.

FIG. 2 illustrates an embodiment of the invention describing method steps to achieve size reduction of a statistical timing abstract model.

Block 201 shows the results obtained from a detailed delay characterization of an input slew dependent timing arc. A set of m input slews ($Slew_1$, $Slew_2$, $Slew_3$, ..., $Slew_m$) is used for the characterization, in which for each input slew $Slew_i$, a statistical delay of the timing arc is obtained in parameterized form with a mean delay $M_i$, and a sensitivity $S_{ij}$ to each parameter $X_j$. The size of the table to store the information is given by m(1+n) or (m+mn), since a mean value is stored along with a set of n sensitivities (corresponding to n−1 global parameters and one local parameter) for each of the m input slew characterizations.

In block 202, a model size versus accuracy trade-off is performed, wherein the size of the table storing the above information is reduced to (m+n) instead of (m+mn). In the reduced delay characterization model, only mean delay values $M_i$ are preferably stored as a function of the input slew $Slew_i$. Sensitivities are stored relative to the mean delays (as fractions of the mean delay), although not as absolute numbers. In addition, the relative sensitivities are not stored as a function of varying input slews, but are approximated to be constant.

In another embodiment, the relative sensitivity of the delay of the timing arc to a parameter $X_j$ for an input slew $Slew_i$ is determined by $S_{ij}/M_i$. The ratio is obtained for various slew values (from i=1 to m) and is approximated to a constant $S'_j$, which is independent of i and finally stored in the abstract. The approximation is preferably obtained using a least mean square error fitting. In yet another embodiment, the sensitivities are stored as a function of the mean output slew instead of the mean delay. The abstract model may also store a projected value of the delay or slew instead of the mean delay or slew. This may additionally require that the sigma projection value of the delay or slew be stored in the abstract for accurate recreation of the original parameterized statistical form during a chip level timing analysis run.

Although the relative sensitivity value or ratio is stored as a constant (i.e., independent of the input slew), the corresponding absolute sensitivity value becomes input slew dependent during chip level timing analysis since the absolute value obtained by scaling the ratio by the mean delay (or the output slew) depends on the input slew.

The method for achieving a abstract model size reduction is also applicable to timing arcs that are load dependent as well as those that are both input slew and load dependent. In the latter case, the model size is reduced from $m_1 m_2(1+n)$ to $(m_1 m_2 + n)$, where $m_1$ is the number of input slew characterization points, and $m_2$ is the number of load characterization points. The method may be applied for guard-time characterization tables as well.

The model size reduction technique may be applied selectively as a means of model size versus accuracy trade-off If an error incurred when fitting the $S_{ij}/M_i$ ratio greater than a threshold, the detailed model shown in block 201 of FIG. 2 is retained.

Timing graph compression is a step used during abstraction. During process timing, the arcs are merged (serial and parallel merge) and may involve introduction of new timing points in the timing graph. Statistical abstraction involves statistical calculations for merge operations, that includes statistical addition, subtraction, maximum, and minimum on the characterized parameterized timing quantities of the timing arcs.

Block 301 in FIG. 3 shows an illustrative chain of four inverter gates having a primary input A and a primary output Z. The statistical delays across each of the four inverters are given in a parameterized form (e.g., described in EQ. 1) as $T_1$, $T_2$, $T_3$, and $T_4$ (ignoring wire delays for illustration). Statistical abstraction merges the arcs between A and Z to obtain a single timing arc as shown in Block 302. If the arc delays $T_1$, through $T_4$ are not slew or load dependent, the delay of the merged arc shown in Block 302 is obtained by statistical addition of the delays given by:

$$T_{compressed} = T_1 + T_2 + T_3 + T_4 \quad \text{(EQ. 2)}$$

If the arc delays are slew(s) and/or load dependent, the statistical merge operation preferably performs multiple statistical addition operations to obtain a slew and (or) load dependent compressed arc. Although the compressed arc loses certain details of the original arcs such as, e.g., if they are arcs across a gate or a wire, or across a gate made using high or low threshold voltage devices and the like, in which case timing variability information for the arcs is preserved accurately in the compressed arc. By way of example, for illustrative purposes, the deterministic delays across each inverter in Block 301 (FIG. 3) is assumed to be 100 picoseconds, and it is assumed further that each inverter is sensitive to only a local parameter of variation with per sigma sensitivity given as 10% of the deterministic delay. If the deterministic delay is assumed to be the mean delay, the statistical parameterized form of the delay across each inverter is given by equation $$T_i = 10 + 1 \Delta R_{T_i} \quad \text{(EQ. 3)}$$

Assuming a 10% sensitivity associated with a local parameter, such as one performed when running macro timing models, the present invention models the statistical delay across the four inverters (ignoring wire delay) as shown in equation 4

$$T_1 + T_2 + T_3 + T_4 = 10 + 10 + 10 + 10 + \sqrt{1^2 + 1^2 + 1^2 + 1^2} \Delta R_T = 40 + 2 \Delta R_T \quad \text{(EQ. 4)}$$

In the deterministic abstraction, the deterministic abstract typically saves only the deterministic delay of 40 picoseconds. In contrast, the statistical abstraction process saves the sensitivity to the local parameter of the delay of the compressed arc as 2 picoseconds if saving absolute sensitivities, or saves the sensitivity ratio as 2/40 or 0.05, when saving relative sensitivities. Using the abstract in a chip level run, the above parametric form of delay is obtained instantly from the saved information. In the prior art, the parametric delay of the compressed timing arc is incorrectly computed as shown in equation 5

$$T_{compressed} = 40 + 4\Delta R_T \qquad (EQ. 5)$$

The present invention, however, correctly models the parametric delay of the compressed timing arc previously shown with reference to equation 4.

The simple illustrative example highlights the benefits of the present invention towards accurately capturing timing variability in the abstracts. Although embodiments of the invention in the example are described in terms of sensitivity to a local parameter, it will appreciated that the concepts of embodiments of the present invention may be equally applied to multiple sources of variation as well. The statistical output slew of the compressed arc is derived from the statistical output slew of the last arc merged in during the series merge process.

Figure 4:
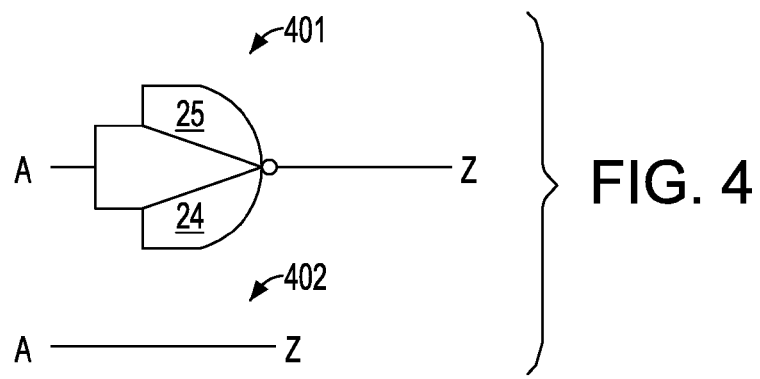
FIG. 4 illustrates a two input NAND gate.

Referring to FIG. 4, Block 401 shows a two input NAND gate with a both inputs provided from a single source A, and an output Z. The statistical delays across each input to output pair of the gate are shown in parameterized form, (e.g., as described in EQ. 1 as $T_1$, and $T_2$. The statistical abstraction merges the arcs between the two inputs and Z to obtain a single timing arc, as shown in Block 402. If the arc delays $T_1$ and $T_2$ are not slew or load dependent, the latest delay of the merged arc shown in Block 302 is obtained by a statistical maximum of the delays given by $$T_{compressed} = \max(T_1, T_2). \qquad (EQ. 6)$$

If the arc delays are slew and/or load dependent, the statistical merge operation may perform multiple statistical maximum operations to obtain the slew and/or load dependent compressed arc. Although the compressed arc loses details of the original arcs like if they are arcs across a gate or a wire, or if they are across a gate made using high or low threshold voltage devices and the like, the timing variability information for the arcs are preserved accurately in the compressed arc. By way of example, assuming that the deterministic delays from the two inputs to the output of the NAND gate in Block 401 are 25 and 24 picoseconds, respectively. It is further assumed that delay across each arc is sensitive to only a local parameter of variation with per sigma sensitivity given as 10% of the deterministic delay. If the deterministic delay is assumed to be the mean delay, the statistical parameterized form of the delay across the two input-to-output arcs is given by the equation $$T_1 = 24 + 2.4\Delta R_{T1}, T_2 = 25 + 2.5\Delta R_{T2} \qquad (EQ. 7)$$

The latest statistical delay from single the source A to the output Z is preferably determined by using a statistical maximum operation described by Visweswariah et al. in "First-order incremental block-based statistical timing analysis", Proceedings of the Design Automation Conference, 2004, pp. 331-336.

$$\max(T_1, T_2) = 25.9 + 2.06\Delta R_T \qquad (EQ. 8)$$

In deterministic abstraction, the deterministic abstract typically saves only the deterministic delay obtained by a deterministic maximum of delays 24 and 25 picoseconds to obtain a mean delay of the compressed arc of 25 picoseconds. In contrast, the statistical abstraction process saves the sensitivity to the local parameter of the delay of the compressed arc as 2.06 picoseconds for saving absolute sensitivities, or save the sensitivity ratio as 2.06/25.9 or 0.0795 for saving relative sensitivities. When using the abstract in a chip level run, the above parametric form of delay is instantly obtained from the information saved. On the other hand, in the prior art, the parametric delay of the compressed timing arc is incorrectly computed by equation $$T_{compressed} = 25 + 2.5\Delta R_T \qquad (EQ. 9)$$

The present invention, however, correctly models the parametric delay of the compressed timing arc, as previously shown with reference to equation 8.

The illustrative example highlights benefits of the present invention towards capturing timing variability in abstracts accurately. Although embodiments of the invention in the example are described in terms of sensitivity to a local parameter, it will be appreciated that concepts of the present invention may equally be applied to multiple sources of variation as well. In addition, a similar approach using statistical minimum operations is employed during statistical abstraction to obtain the earliest delay for the compressed arc. The statistical output slew of the compressed arc is derived by statistical maximum or minimum operations on the output slews of the arcs being merged.

In addition, arcs denoting timing tests may be merged with other timing arcs using the statistical operations described above. The statistical abstract of the macro may even be generated as an industry standard statistical timing model. Alternatively, the statistical abstract may be generated as a deterministic abstract model with additional file(s) that includes timing variability information of the abstracted macro.

The method 100 for generating a statistical timing abstract model of a given VLSI circuit or macro terminates in step 105.

Figure 5:
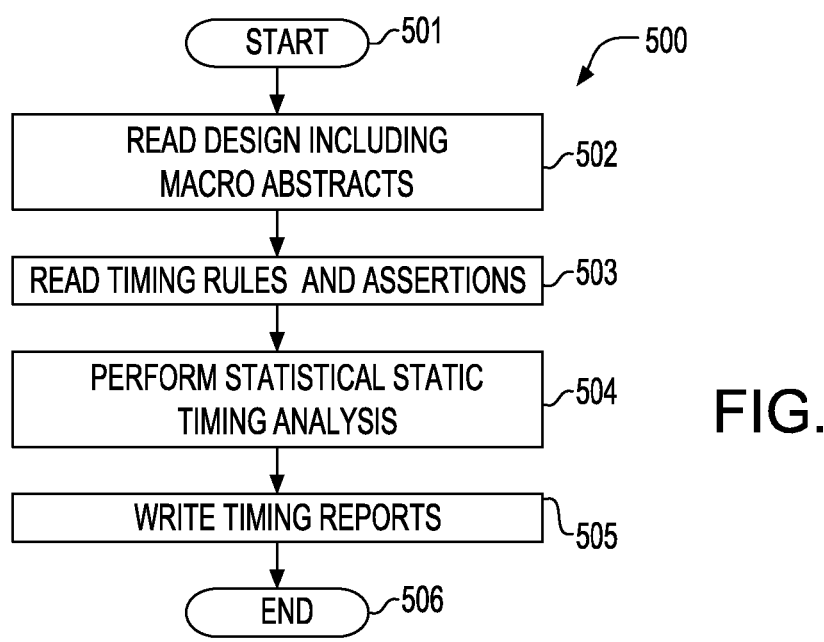
FIG. 5 is a flowchart illustrating method steps of a hierarchical chip timing flow that uses statistical timing abstracts, according to an embodiment of the invention.

Referring now to FIG. 5, there is shown a flow diagram illustrating one embodiment of method 500 for a hierarchical statistical timing analysis at the chip level of the IC chip.

The method 500 begins in step 501. In step 502, the circuit is read along with the statistical timing abstract models for all macros that have been abstracted (using the method 100 illustrated in FIG. 1). At a hierarchical level, the circuit may contain logic components that were not abstracted with original timing models. Step 502 also sets up sources of variation or parameters for a statistical timing.

In step 503, timing rules for the macros (in form of statistical abstracts) and for those parts of the circuit that have not been abstracted are read in. Timing assertions for the circuit are also read in during this step.

In step 504, a hierarchical statistical static timing analysis of the circuit is performed, wherein timing quantities like delays and slews are represented as random variables having known distributions and are propagated throughout the timing graph to obtain the arrival times at the primary outputs. The required arrival times are propagated in a conventional manner, and slacks are obtained at every timing point of the timing graph. The step may include typical static timing analysis components like coupling analysis, common path pessimism reduction, and report generation. Since the statistical timing information of the macros are captured accurately as look-up tables in the abstract, the timing analysis of the macros is performed very efficiently.

Selective statistical timing reports are generated in step 505. The method 500 terminates at step 506.

It should be noted that although not explicitly specified, one or more steps of the methods described herein may include storing, displaying and/or outputting step as required for a particular application. Moreover, any data, records, fields, and/or intermediate results discussed in the methods can be stored, displayed, and/or outputted to another device as required for a particular application. Furthermore, steps or blocks in the accompanying figures that recite a determining operation or involve a decision, do not necessarily require that both branches of the determining operation be practiced. In other words, one of the branches of the determining operation can be deemed as an optional step.

Finally, the present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of improving an integrated circuit (IC) chip performance by performing a hierarchical statistical timing analysis of the IC chip design, the method comprising:
   a) using a computer, performing a statistical static timing analysis on at least one macro of said IC chip design;
   b) performing a statistical abstraction of said at least one macro to generate a statistical abstract model of its timing characteristics;
   c) applying said statistical abstract model as the timing model for each occurrence of said at least one macro leading to a simplified IC chip design; and
   d) performing a hierarchical statistical timing analysis of said simplified IC chip design, and modifying said IC chip design based thereon.

2. The method as recited in claim 1, wherein performing said abstraction includes characterizing at least one of: a) delay, b) guard-time, c) output slew, and d) output waveform of timing arcs of a timing graph of said macro in statistical parameterized form.

3. The method as recited in claim 2, wherein said characterized statistical parameterized form is a function of at least one of input slew(s) and of output capacitive load.

4. The method as recited in claim 2, wherein the guard-time of said timing arcs is characterized as a function of slew(s) or waveform(s) at one or both ends of said timing arc.

5. The method as recited in claim 4 further comprises storing a sensitivity of a characterized statistical guard-time of said timing arc of said macro to any source of variation relative to a mean guard-time or a deterministic guard-time of said timing arc as a fraction that is independent of input slews at the ends of the said timing arc.

6. The method as recited in claim 1, wherein said performing said statistical abstraction of at least one macro to generate a statistical abstract model of its timing characteristics further comprises compressing said timing graph by merging operations on said timing arcs that include statistical addition, subtraction, maximum, and minimum on said characterized parameterized timing quantities of said timing arcs.

7. The method as recited in claim 1, wherein said generating statistical abstract model includes a statistical complete abstract, a statistical boundary abstract, a statistical blackbox abstract or any other abstraction.

8. The method as recited in claim 1, further comprises storing a sensitivity of a characterized statistical delay or output slew of a timing arc in said at least one macro to any source of variation relative to at least one of: a mean delay, output slew, deterministic delay or deterministic slew of the timing arc as a fraction that is independent of input slew and output load.

9. The method as recited in claim 1, wherein generating said statistical abstract model comprises generating a deterministic abstract model and a model containing timing variability information of said macro being abstracted.

10. The method as recited in claim 1, wherein step d) is performed during chip verification or sign-off of said IC chip design.

11. The method as recited in claim 1, wherein step d) is performed during chip design timing optimization of said IC chip design.

12. The method as recited in claim 11 wherein the statistical timing analysis is performed at higher levels of said hierarchy obtained by characterizing statistical delays and slews.

13. The method as recited in claim 12, wherein generating said timing abstract model preserves required timing checks of said IC chip at its input and output boundaries.

14. The method as recited in claim 1 further comprising performing said statistical timing analysis extending over a plurality of hierarchical levels.

15. The method as recited in claim 1 further comprising performing said statistical timing analysis at a gate level, at transistor level, or any combination thereof.

16. A program storage device readable by a machine, tangibly embodying a program of instructions executable by the machine to perform method steps for improving an integrated circuit (IC) chip performance by performing a hierarchical statistical timing analysis of the IC chip design, the method comprising:
   a) using a computer, performing a statistical static timing analysis on at least one macro of said IC chip design;
   b) performing a statistical abstraction of said at least one macro to generate a statistical abstract model of its timing characteristics;
   c) applying said statistical abstract model as the timing model for each occurrence of said at least one macro leading to a simplified IC chip design; and
   d) performing a hierarchical statistical timing analysis of said simplified IC chip design, and modifying said IC chip design based thereon.

* * * * *